United States Patent
Yang et al.

(10) Patent No.: US 9,997,111 B2
(45) Date of Patent: Jun. 12, 2018

(54) CIRCUIT AND METHOD FOR GENERATION OF LIGHT EMISSION CONTROL SIGNAL AND PIXEL CIRCUIT DRIVING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Panhua Wang, Beijing (CN); Hailin Xue, Beijing (CN); Xiaochuan Chen, Beijing (CN); Haisheng Wang, Beijing (CN); Hongjuan Liu, Beijing (CN); Weijie Zhao, Beijing (CN); Chunlei Wang, Beijing (CN); Wei Li, Beijing (CN); Yingming Liu, Beijing (CN)

(73) Assignees: BOE TECHNOLOGY GROUP., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days. days.

(21) Appl. No.: 15/518,448

(22) PCT Filed: Dec. 11, 2015

(86) PCT No.: PCT/CN2015/097113
§ 371 (c)(1),
(2) Date: Apr. 11, 2017

(87) PCT Pub. No.: WO2017/013868
PCT Pub. Date: Mar. 2, 2017

(65) Prior Publication Data
US 2017/0316740 A1   Nov. 2, 2017

(30) Foreign Application Priority Data

Aug. 26, 2015  (CN) .......................... 2015 1 0529204

(51) Int. Cl.
G09G 3/3258  (2016.01)
H01L 27/32  (2006.01)
G06F 3/041  (2006.01)

(52) U.S. Cl.
CPC ......... *G09G 3/3258* (2013.01); *G06F 3/0412* (2013.01); *H01L 27/323* (2013.01); *H01L 27/3248* (2013.01); *G09G 2300/0809* (2013.01)

(58) Field of Classification Search
CPC .......... G09G 3/3258; G09G 2300/0809; G06F 3/0412; H01L 27/323; H01L 2/3248
See application file for complete search history.

(56) References Cited

U.S. PATENT DOCUMENTS

| 8,232,978 B2 | 7/2012 | Chiang et al. |
| 2003/0111588 A1 | 6/2003 | Chen |

(Continued)

FOREIGN PATENT DOCUMENTS

| CN | 102298473 A | 12/2011 |
| CN | 103415827 A | 11/2013 |

(Continued)

OTHER PUBLICATIONS

Office Action in Chinese Application No. 201510529204.9 dated Jan. 26, 2017, with English translation. 9 pages.

(Continued)

*Primary Examiner* — Sejoon Ahn
(74) *Attorney, Agent, or Firm* — Womble Bond Dickinson (US) LLP

(57) ABSTRACT

The present disclosure discloses a circuit and method for generating a light emission control signal for an AMOLED (Continued)

pixel circuit having in-cell touch sensors, as well as a pixel circuit driving method. The circuit comprises a first transistor, a second transistor, a third transistor, a fourth transistor and a first capacitor. Under control of a control signal transferred by a first control line, a first clock signal, a second clock signal, a voltage of a first level, a voltage of a second level and a control signal transferred by a second control line, the circuit outputs the desired light emission control signal via a light emission control line. The light emission control signal may turn off the OLED in the pixel circuit during a touch sense phase such that an influence of the capacitance between the anode and cathode of the OLED on the touch sensor-to-ground capacitance is reduced.

8 Claims, 6 Drawing Sheets

(56) References Cited

U.S. PATENT DOCUMENTS

| | | | | |
|---|---|---|---|---|
| 2006/0256057 A1* | 11/2006 | Han | ............... | G09G 3/3258 345/92 |
| 2010/0013824 A1* | 1/2010 | Kim | ............... | G09G 3/3266 345/214 |
| 2012/0001896 A1* | 1/2012 | Han | ............... | G09G 3/3233 345/214 |
| 2012/0139962 A1* | 6/2012 | Chung | ............... | G09G 3/3266 345/690 |
| 2013/0314342 A1* | 11/2013 | Kim | ............... | G06F 3/041 345/173 |
| 2014/0362042 A1* | 12/2014 | Noguchi | ............... | G06F 3/0412 345/174 |
| 2015/0042613 A1 | 2/2015 | Kim | | |
| 2015/0220201 A1* | 8/2015 | Wu | ............... | G06F 3/0412 345/173 |
| 2016/0019827 A1* | 1/2016 | Lee | ............... | G09G 3/3208 345/204 |

FOREIGN PATENT DOCUMENTS

| | | |
|---|---|---|
| CN | 203520831 U | 4/2014 |
| CN | 203811939 U | 9/2014 |
| CN | 104850270 A | 8/2015 |
| CN | 105096833 A | 11/2015 |
| JP | 2000330090 A | 11/2000 |
| KR | 20120083143 A | 7/2012 |

OTHER PUBLICATIONS

International Search Report and Written Opinion in PCT/CN2015/097113 dated May 10, 2016, with English translation. 15 pages.

\* cited by examiner

CIRCUIT AND METHOD FOR GENERATION OF LIGHT EMISSION CONTROL SIGNAL AND PIXEL CIRCUIT DRIVING METHOD

CROSS-REFERENCE TO RELATED APPLICATIONS

The present application is the U.S. national phase entry of PCT/CN2015/097113, with an international filing date of Dec. 11, 2015, which claims the benefit of Chinese Patent Application No. 201510529204.9, filed on Aug. 26, 2015, the entire disclosures of which are incorporated herein by reference.

TECHNICAL FIELD

The present disclosure relates to the field of display technologies, and more particularly to a circuit and method for generating a light emission control signal and a method of driving a pixel circuit.

BACKGROUND

Active matrix organic light-emitting diode (AMOLED) display panels have been presented that have in-cell touch sensors, where the cathode of the organic light-emitting diode (OLED) is divided into a plurality of separate electrode areas, each serving as a touch sensor to which a touch scan signal is applied during a touch sense phase.

Due to its working principle, such an in-cell touch sensor has a strict requirement for the cathode-to-ground capacitance (self-capacitance) of the OLED. I.e., influence of potential additional capacitance (e.g., capacitance between the anode and cathode of the OLED) on the self-capacitance should be avoided at the largest extent in an AMOLED pixel circuit to ensure a good accuracy for touch sensing. Currently, there is no satisfactory solution that can meet such a requirement.

Thus, there is a need for an improved working mechanism for the AMOLED pixel circuit having in-cell touch sensors.

SUMMARY

It would be advantageous to provide a circuit for generating a light emission control signal for an AMOLED pixel circuit having in-cell touch sensors, which light emission control signal may turn off the OLED in the pixel circuit during a touch sense phase such that an influence of the capacitance between the anode and cathode of the OLED on the touch sensor-to-ground capacitance is reduced. It would also be desirable to provide a method for generating the light emission control signal using the circuit and a method of driving the AMOLED pixel circuit using the light emission control signal.

According to a first aspect of the present disclosure, a circuit for generating a light emission control signal for an AMOLED pixel circuit having in-cell touch sensors is provided which comprises: a first transistor having a gate electrode connected to a first control line, a first electrode for being supplied with a voltage of a first level, and a second electrode connected to a first node, the first control line transferring a first control signal; a second transistor having a gate electrode for being supplied with a first clock signal, a first electrode for being supplied with a voltage of a second level, and a second electrode connected to the first node; a first capacitor having a terminal connected to the first node and another terminal for being supplied with a second clock signal; a third transistor having a gate electrode connected to the first control line, a first electrode for being supplied with the voltage of the first level, and a second electrode connected to a light emission control line; and a fourth transistor having a gate electrode connected to the first node, a first electrode connected to a second control line, and a second electrode connected to the light emission control line, the second control line transferring a second control signal having the second level during a display phase and being a signal resulting from superposition of a touch scan signal on the voltage of the first level during a touch sense phase. Only one of the third transistor and the fourth transistor is turned on at any given time under control of the first control signal and a voltage at the first node.

In an embodiment, the first transistor, the second transistor, the third transistor and the fourth transistor are P-type thin film transistors, the first level is a high level, and the second level is a low level.

According to a second aspect of the present disclosure, a method for generating the light emission control signal using the circuit as described in the first aspect is provided. The display phase comprises a first period of time corresponding to a half period of the first clock signal and a second period of time corresponding to one or more periods of the first clock signal. The method comprises: maintaining, during the first period of time of the display phase, the first clock signal at the first level, the second clock signal, as an inverted version of the first clock signal, at the second level, and the first control signal at the second level, such that the third transistor is turned on to output the voltage of the first level via the light emission control line; maintaining, during the second period of time of the display phase, the first control signal at the first level such that the fourth transistor is turned on to output the second control signal via the light emission control line; and maintaining, during the touch sense phase, the first control signal at the first level such that the fourth transistor is turned on to output the second control signal via the light emission control line.

According to a third aspect of the present disclosure, a method of driving the AMOLED pixel circuit using the light emission control signal generated by the method as described in the second aspect is provided. The AMOLED pixel circuit comprises an OLED with a cathode, the light emission control line and a light emission control transistor, the cathode of the OLED connected to a first power source and serving as a touch sensor, the light emission control transistor having a gate electrode connected to the light emission control line and configured to control ON/OFF of a current flowing through the OLED. The method comprises applying the light emission control signal to the light emission control line to cause the AMOLED pixel circuit to operate to: turn off the light emission control transistor and perform a data write operation, during the first period of time of the display phase; turn on the light emission control transistor to perform an OLED light emission operation, during the second period of time of the display phase; and turn off the light emission control transistor to perform a touch sense operation with the OLED turned off, during the touch sense phase.

In an embodiment, the light emission control transistor is a P-type thin film transistor.

In an embodiment, a reset operation is performed by the AMOLED pixel circuit prior to the data write operation during the first period of time of the display phase.

In an embodiment, the touch scan signal is synchronously superposed on signals applied to all other external terminals of the AMOLED pixel circuit at the same time when the light emission control signal is applied to the light emission control line and the touch scan signal is applied to the first power source, during the touch sense phase.

In an embodiment, the display phase and the touch sense phase occur alternatingly to the AMOLED pixel circuit in a time-divisional manner.

These and other aspects of the present disclosure will be apparent from and elucidated with reference to the embodiment(s) described hereinafter.

DETAILED DESCRIPTION

Embodiments of the present disclosure will be described in detail with reference to the accompanying drawings.

Figure 1:
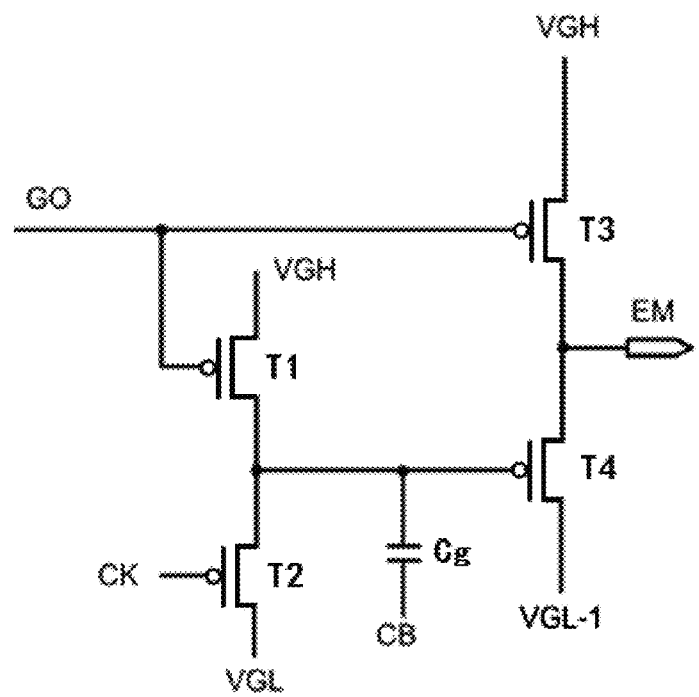
FIG. 1 shows a circuit diagram of a circuit for generating a light emission control signal for an AMOLED pixel circuit having in-cell touch sensors according to an embodiment of the present disclosure.
Figure 2A:
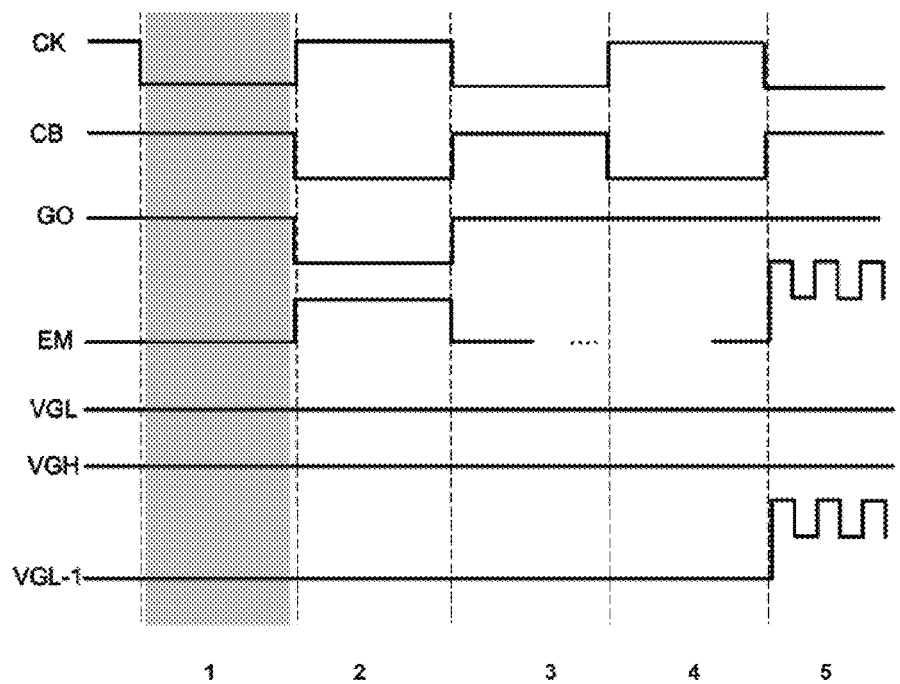
FIGS. 2(a) to 2(e) show timing diagrams of operations for generation of the light emission control signal using the circuit as shown in FIG. 1.
Figure 2B:
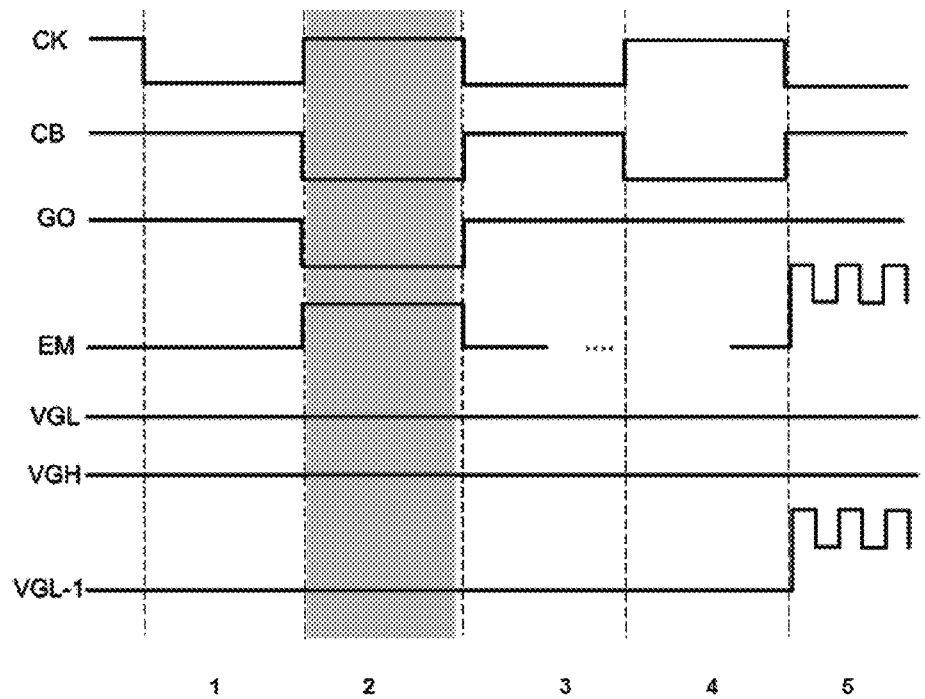
Figure 2C:
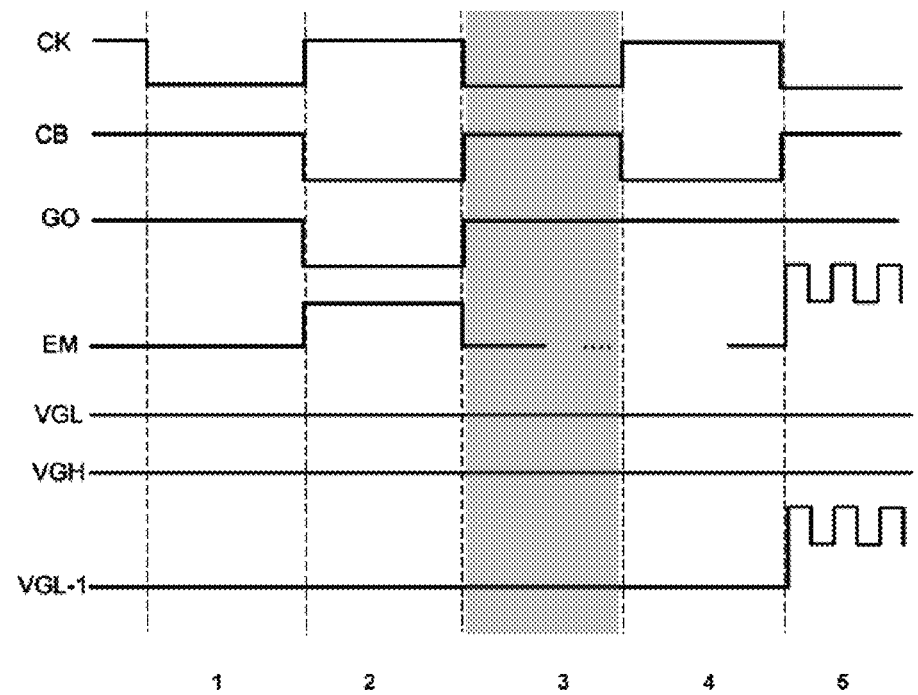
Figure 2D:
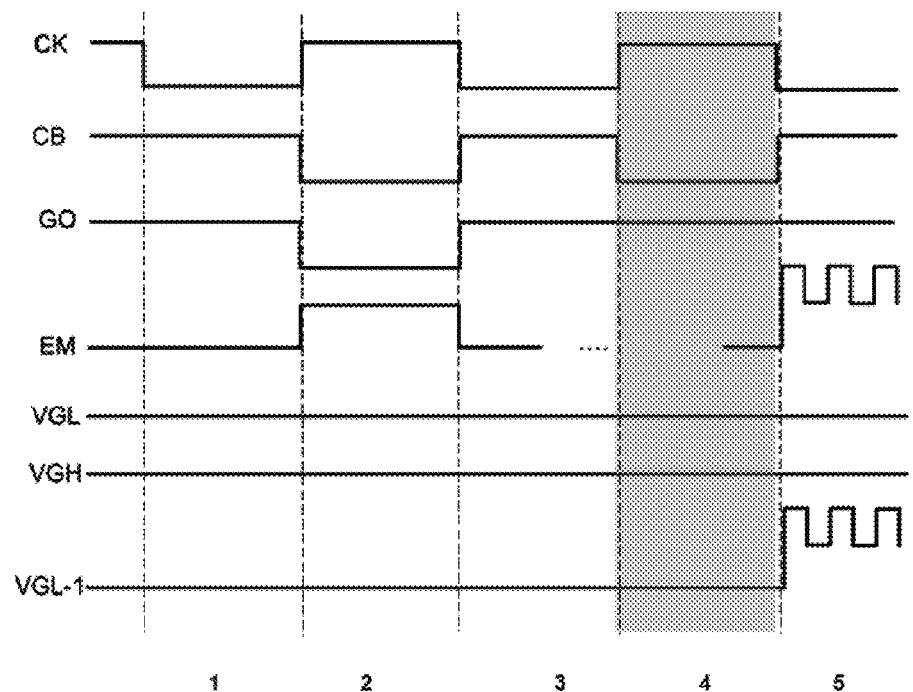
Figure 2E:
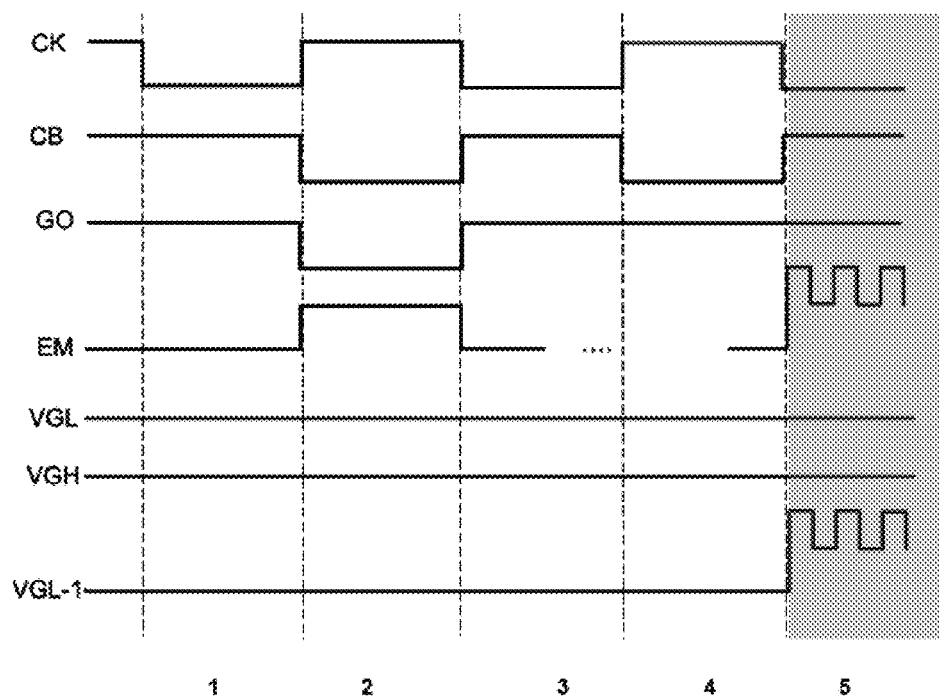

FIG. 1 shows a circuit diagram of a circuit for generating a light emission control signal for an AMOLED pixel circuit having in-cell touch sensors according to an embodiment of the present disclosure. As shown in the figure, the circuit includes a first transistor T1, a second transistor T2, a third transistor T3, a fourth transistor T4 and a first capacitor Cg. Under control of a control signal transferred by a first control line GO, a first clock signal CK, a second clock signal CB, a voltage of a first level VGH, a voltage of a second level VGL and a control signal transferred by a second control line VGL_1, the circuit outputs a desired light emission control signal via a light emission control line EM.

More specifically, the first transistor T1 has a gate electrode connected to the first control line GO, a first electrode for being supplied with the voltage of the first level VGH, and a second electrode connected to a first node N. The first control line GO transfers a first control signal. In an example, the first control signal may be provided by a gate driver on array (GOA) circuit of the AMOLED display. However, the first control signal may also be provided by a separate timing generation circuit.

The second transistor T2 has a gate electrode for being supplied with the first clock signal CK, a first electrode for being supplied with the voltage of the second level VGL, and a second electrode connected to the first node N.

The first capacitor Cg has a terminal connected to the first node N and another terminal for being supplied with the second clock signal CB. The second clock signal CB may be an inverted version of the first clock signal CK.

The third transistor T3 has a gate electrode connected to the first control line GO, a first electrode for being supplied with the voltage of the first level VGH, and a second electrode connected to the light emission control line EM.

The fourth transistor T4 has a gate electrode connected to the first node N, a first electrode connected to the second control line VGL_1, and a second electrode connected to the light emission control line EM. The second control line VGL_1 transfers a second control signal.

Under control of the first control signal and a voltage at the first node N, only one of the third transistor T3 and the fourth transistor T4 is turned on at any given time. In other words, the voltage of the first level and the second control signal from the second control line VGL_1 are selectively output via the light emission control line EM to provide the light emission control signal.

In the example as illustrated, the transistors T1 to T4 may be P-type thin film transistors, which are turned on when the gate electrodes thereof are at a low level and turned off when the gate electrode thereof are at a high level. In addition, the first level is a high level, and the second level is a low level. However, embodiments of the present disclosure are not limited thereto. The type of the transistors and the level logic of the first level and the second level may be selected based on the fabrication processes of the circuit and the AMOLED pixel circuit with which it is used.

FIGS. 2(a) to 2(e) show timing diagrams of operations for generation of the light emission control signal using the circuit as shown in FIG. 1. As shown in the figures, the operations include five processes 1, 2, 3, 4 and 5 as indicated by the numbers in the figures, wherein process 1 corresponds to an initial state of the circuit, processes 2 to 4 correspond to a display phase of the AMOLED display, and process 5 corresponds to a touch sense phase of the AMOLED display. As is known, the display phase and the touch sense phase occur alternatingly in a time-divisional manner. Further, the display phase includes a first period of time corresponding to a half period of the first clock signal CK (illustrated as process 2) and a second period of time corresponding to one or more periods of the first clock signal CK (illustrated as processed 3 and 4).

The operations for generation of the light emission control signal are described below with reference to FIG. 1 and FIGS. 2(a) to 2(e). In the initial state (process 1), the first control signal from the first control line GO is at a high level such that the first transistor T1 and the third transistor T3 are turned off. The first clock signal CK is at a low level such that the second transistor T2 is turned on, and the voltage of the second level (i.e., the low level) VGL is applied to the first node N through the second transistor T2. The fourth transistor T4 is then turned on such that the second control signal from the second control line VGL_1 is output to the light emission control line EM through the fourth transistor T4.

In the first period of time (process 2) of the display phase, the first clock signal CK is at a high level such that the second transistor T2 is turned off. The first control signal from the first control line GO is at a low level such that the first transistor T1 and the third transistor T3 are turned on, and the voltage of the first level (i.e., the high level) VGH is applied to the first node N through the first transistor T1. The fourth transistor T4 is then turned off. The voltage of the first level VGH is output to the light emission control line EM through the third transistor T3.

In process 3 of the second period of time of the display phase, the first control signal from the first control line GO is at a high level such that the first transistor T1 and the third transistor T3 are turned off. The first clock signal CK is at a low level such that the second transistor T2 is turned on, and the voltage of the second level (i.e., the low level) VGL is applied to the first node N through the second transistor T2. The fourth transistor T4 is then turned on such that the second control signal from the second control line VGL_1 is output to the light emission control line EM through the fourth transistor T4.

In process 4 of the second period of time of the display phase, the first control signal from the first control line GO is at a high level such that the first transistor T1 and the third transistor T3 are turned off. The first clock signal CK is at a high level such that the second transistor T2 is turned off. The second clock signal CB transitions from the high level in process 3 to a low level, and thus pulls the voltage at the first node N from a low level down to an even lower level by way of the first capacitor Cg. The fourth transistor T4 is then turned on such that the second control signal from the second control line VGL_1 is output to the light emission control line EM through the fourth transistor T4.

In the touch sense phase (process 5), the first control signal from the first control line GO is at a high level such that the first transistor T1 and the third transistor T3 are turned off. The first clock signal CK is at a low level such that the second transistor T2 is turned on, and the voltage of the second level (i.e., the low level) VGL is applied to the first node N through the second transistor T2. The fourth transistor T4 is then turned on such that the second control signal from the second control line VGL_1 is output to the light emission control line EM through the fourth transistor T4.

In this way, the desired light emission control signal is output via the light emission control line EM. As shown, the second control signal from the second control line VGL_1 is at the second level during the display phase, and is a signal resulting from superposition of a touch scan signal (indicated by a square wave in FIG. 2(e)) on the voltage of the first level VGH during the touch sense phase. As a result, the light emission control signal is, during the display phase, an inverted signal of the first control signal provided by the first control signal GO and is, during the touch sense phase, a signal resulting from superposition of the touch scan signal on the voltage of the first level VGH.

Figure 3:
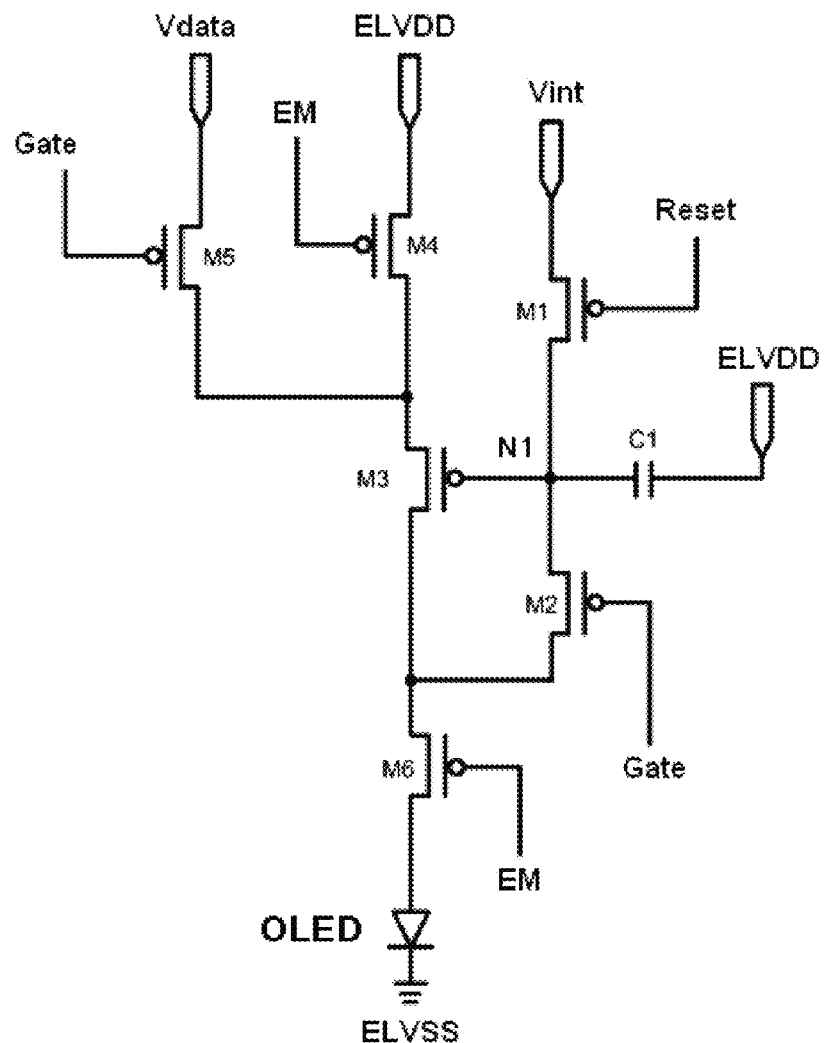
FIG. 3 shows a circuit diagram of an exemplary AMOLED pixel circuit to which the light emission control signal generated in accordance with the operations as shown in FIGS. 2(a) to 2(e) is to be applied.
Figure 4A:
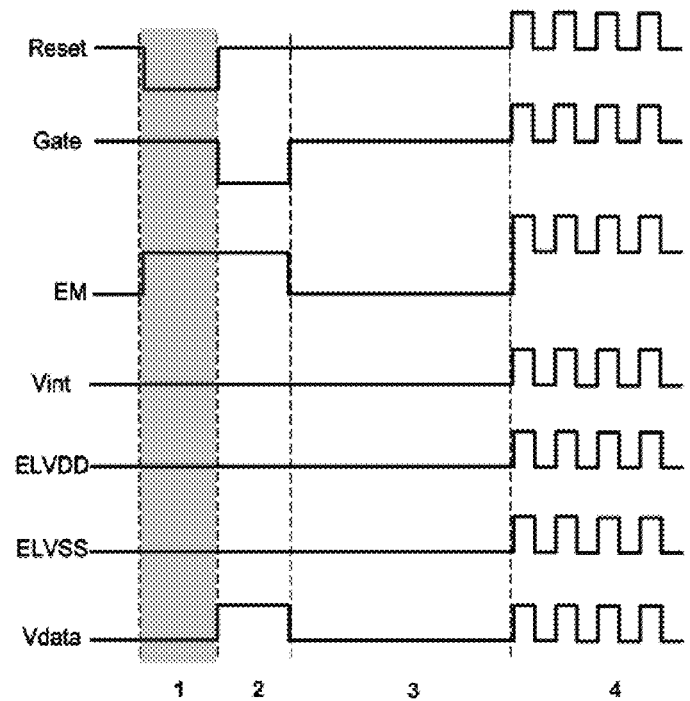
FIGS. 4(a) to 4(d) show timing diagrams of operations of the AMOLED pixel circuit as shown in FIG. 3 in a display phase and a touch sense phase.
Figure 4B:
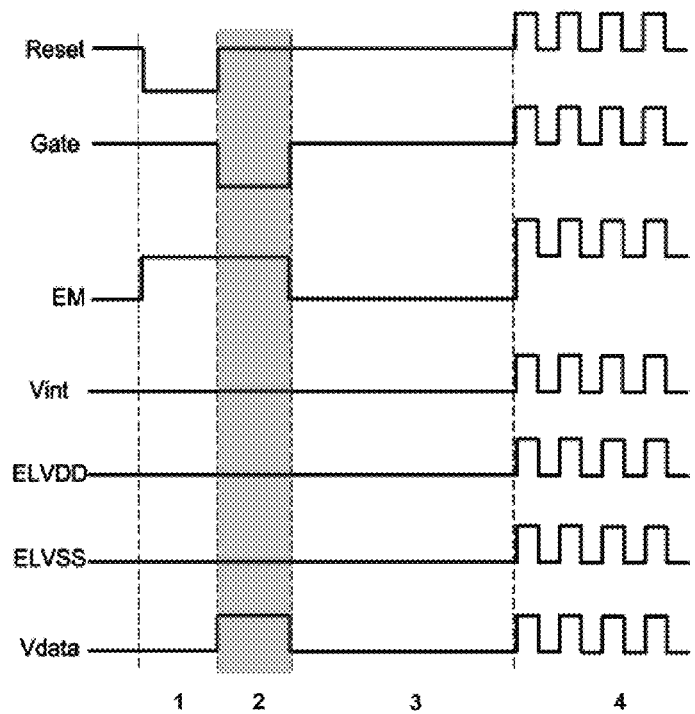
Figure 4C:
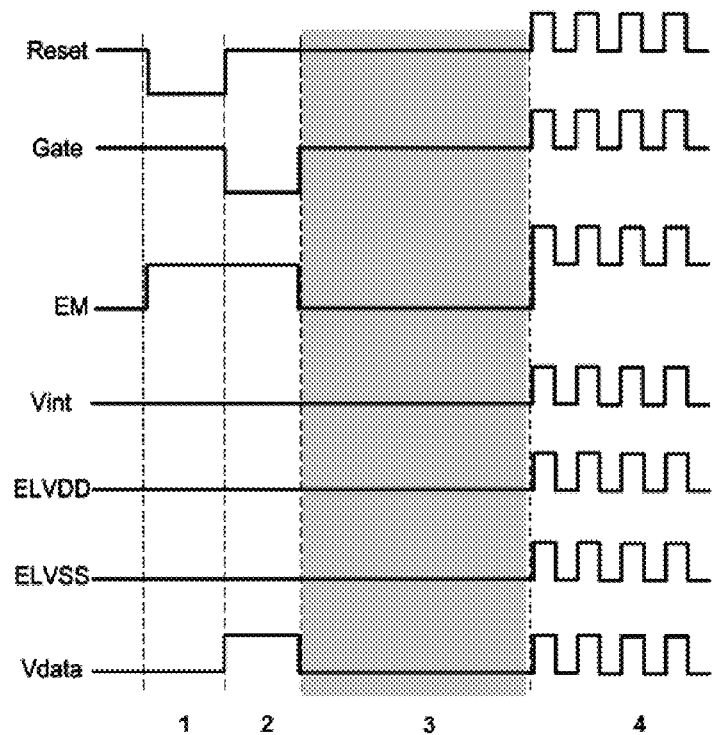
Figure 4D:
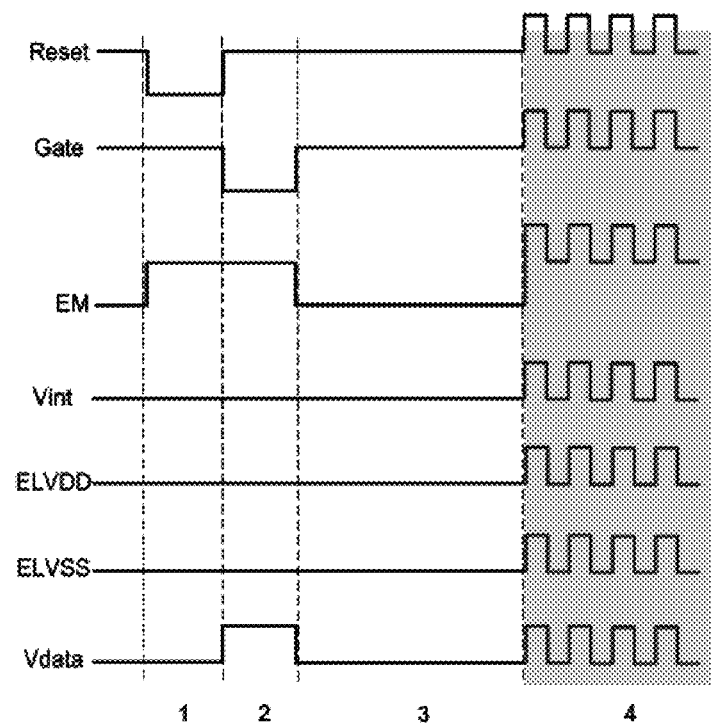

FIG. 3 shows a circuit diagram of an exemplary AMOLED pixel circuit to which the light emission control signal generated in accordance with the operations as shown in FIGS. 2(a) to 2(e) is to be applied. This pixel circuit includes an OLED with a cathode (not shown), the light emission control line EM and light emission control transistors M4, M6. The cathode of the OLED is connected to a first power source ELVSS. The light emission control transistors M4, M6 each have a gate electrode connected to the light emission control line EM and are configured to control ON/OFF of a current flowing through the OLED. Further, for the AMOLED pixel circuit having in-cell touch sensors, the cathode of the OLED is divided into a plurality of separate electrodes, each of which may be used as a touch sensor to which the touch scan signal is applied in the touch sense phase.

More specifically, the pixel circuit includes transistors M1 to M6, a storage capacitor C1 and the OLED. Transistor M1 has a gate electrode connected to a reset signal line "Reset", a first electrode connected to a reference level line Vint, and a second electrode connected to node N1. Transistor M3, which operates as a driving transistor, has a gate electrode connected to node N1, a first electrode connected to a second electrode of transistor M4, and a second electrode connected to a first electrode of transistor M6. Transistor M5 has a gate electrode connected to a gate scan signal line "Gate", a first electrode connected to a data line Vdata, and a second electrode connected to the first electrode of transistor M3. Transistor M4 has a first electrode connected to a second power source ELVDD. Transistor M2 has a gate electrode connected to the gate scan signal line "Gate", a first electrode connected to node N1, and a second electrode connected to the second electrode of transistor M3. Transistor M6 has a first electrode connected to the second electrode of transistor M3 and a second electrode connected to the anode of the OLED. A terminal of the storage capacitor is connected to node N1, and another terminal thereof is connected to the second power source ELVDD. Under control of the signals from the reset signal line "Reset", the gate scan signal line "Gate" and the light emission control line EM, the pixel circuit stores the voltage from the data line Vdata into the storage capacitor C1, and then converts it to a current $I_{OLED}$ that flows through the OLED, thereby achieving a display function. In this example, transistors M1 to M6 may be P-type thin film transistors.

FIGS. 4(a) to 4(d) show timing diagrams of operations of the AMOLED pixel circuit as shown in FIG. 3 in a display phase and a touch sense phase, wherein "EM" is indicative of the light emission control signal that is generated by the circuit and method in accordance with the above embodiments of the present disclosure and which is to be applied to the pixel circuit of FIG. 3. As shown in the figures, the operations include four processes 1, 2, 3 and 4 as indicated by the numbers in the figures, wherein processes 1 to 3 correspond to the display phase of the AMOLED display, and process 4 corresponds to the touch sense phase of the AMOLED display. Further, the display phase includes a first period of time (illustrated as processes 1 and 2) and a second period of time (illustrated as process 3).

The operations of the pixel circuit are described below in detail with reference to FIG. 3 and FIGS. 4(a) to 4(d).

A reset operation is performed in process 1 of the first period of time of the display phase, where transistor M1 is turned on and the other transistors are turned off such that the voltage at node N1 is reset to the reference level (with a potential of 0 V). It will be understood that in some embodiments the reset operation may not occur in the pixel circuit.

A data write operation is performed in process 2 of the first period of time of the display phase, where transistors M2, M3 and M5 are turned on, and transistors M1, M4 and M6 are turned off. As the voltage at node N1 has previously been reset to the reference level of 0 V, the driving transistor M3 is turned on. The signal on the data line Vdata charges node N1 through transistors M5, M3 and M2, in turn, until the voltage at node N1 is charged to Vdata−|Vth| (i.e., the voltage difference between the gate and source of transistor M3 is |Vth|). In this process, since the voltage of the right terminal of the storage capacitor C1 is always maintained at ELVDD, the voltage at node N1 will be maintained at Vdata−|Vth| after completion of the charging. Further, as transistor M6 is turned off, no current will flow through the OLED, reducing the loss in the lifespan of the OLED.

An OLED light emission operation is performed in the second period of time (process 3) of the display phase, where transistors M1, M2 and M5 are turned off, and transistors M3, M4 and M6 are turned on, such that the current flows from the second power source ELVDD to the first power source ELVSS through transistors M4, M3 and M6 as well as the OLED, in turn, causing the OLED to emit light.

It can be derived from the saturation current formula of the transistor that:

$$I_{OLED} = K(V_{GS} - Vth)^2$$
$$= K[(Vdata - |Vth|) - Vdd - Vth]^2$$
$$= K(Vdata - Vdd)^2$$

where K represents a constant value determined by the mobility and parasitic capacitance of the driving transistor M3, $V_{GS}$ represents a voltage difference between the gate and source of the driving transistor M3, and Vth represents a threshold voltage of the driving transistor M3.

As can be seen from the above formula, the working current $I_{OLED}$ is no longer related to Vth, but only to Vdd and Vdata. Therefore, the influence of drift of the threshold voltage (Vth) resulting from the fabrication process and long-term operation of the driving transistor on $I_{OLED}$ is eliminated.

A touch sense operation is performed in the touch sense phase (process 4), where the light emission control signal from the light emission control line EM is a pulled-up voltage signal (a high level voltage superposed with a touch scan signal) such that transistors M4 and M6 are turned off, and thus the OLED. At this time, the anode of the OLED is in a float state, and hence it is unnecessary to account for capacitance between the anode and the cathode serving as a touch sensor. As such, the driving frequency may be effectively increased due to a reduced load of the touch sensor. Furthermore, the touch scan signal is synchronously superposed on the signals applied to all other external terminals, including the reset signal line "Reset", the gate scan signal line "Gate", the reference level line Vint, the second power source ELVDD and the data line Vdata, at the same time when the light emission control signal is applied to the light emission control line EM and the touch scan signal is applied to the cathode electrode of the OLED (the first power source ELVSS), such that all the transistors remain in their previous states (either turned on or off), thus offsetting the influence of potential additional capacitance on the touch sensor.

It will be understood that the light emission control signal generated by the circuit and method in accordance with the embodiments of the present disclosure is not intended to be applied only to the specific pixel circuit as illustrated, but may be applicable to any other AMOLED pixel circuit having in-cell touch sensors that operates based on the principle of the present disclosure (i.e., performing the touch sense operation with the OLED turned off).

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A light emission control signal generation circuit for generating a light emission control signal for an active matrix organic light-emitting diode (AMOLED) pixel circuit, the AMOLED pixel circuit comprising an in-cell touch sensor and an organic light-emitting diode (OLED), the light emission control signal generation circuit comprising:
   a first transistor having a gate electrode connected to a first control line, a first electrode for being supplied with a voltage of a first level, and a second electrode connected to a first node, the first control line configured to transfer a first control signal;
   a second transistor having a gate electrode for being supplied with a first clock signal, a first electrode for being supplied with a voltage of a second level, and a second electrode connected to the first node;
   a first capacitor having a terminal connected to the first node and another terminal for being supplied with a second clock signal;
   a third transistor having a gate electrode connected to the first control line, a first electrode for being supplied with the voltage of the first level, and a second electrode connected to a light emission control line; and
   a fourth transistor having a gate electrode connected to the first node, a first electrode connected to a second control line, and a second electrode connected to the light emission control line, the second control line configured to transfer a second control signal, the second control signal having the second level during a display phase and being a superposition of a touch scan signal and the voltage of the first level during a touch sense phase,
   wherein the third transistor and the fourth transistor are configured such that only one of the third transistor and the fourth transistor is turned on at any given time under control of the first control signal and a voltage at the first node, and
   wherein the fourth transistor is configured such that it is turned on during the touch sense phase to output the second control signal to the light emission control line as the light emission control signal, the light emission control signal enabling the OLED to be turned off during the touch sense phase.

2. The light emission control signal generation circuit of claim 1, wherein the first transistor, the second transistor, the third transistor and the fourth transistor are P-type thin film transistors, and wherein the first level is a high level and the second level is a low level.

3. A method for generating a light emission control signal using a light emission control signal generation circuit for an active matrix organic light-emitting diode (AMOLED) pixel circuit, the AMOLED pixel circuit comprising an in-cell touch sensor and an organic light-emitting diode (OLED), the light emission control signal generation circuit comprising: a first transistor having a gate electrode connected to a first control line, a first electrode for being supplied with a voltage of a first level, and a second electrode connected to a first node, the first control line configured to transfer a first control signal; a second transistor having a gate electrode for being supplied with a first clock signal, a first electrode for being supplied with a voltage of a second level, and a second electrode connected to the first node; a first capacitor having a terminal connected to the first node and another terminal for being supplied with a second clock signal; a third transistor having a gate electrode connected to the first control line, a first electrode for being supplied with the voltage of the first level, and a second electrode connected to a light emission control line; and a fourth transistor having a gate electrode connected to the first node, a first electrode connected to a second control line, and a second electrode connected to the light emission control line, the second control line configured to transfer a second control signal, the second control signal having the second level during a display phase and being a superposition of a touch scan signal and the voltage of the first level during a touch sense phase, the third transistor and the fourth transistor being configured such that only one of the third transistor and the fourth transistor is turned on at any given time under control of the first control signal and a voltage at the first node, the fourth transistor being configured such that it is turned on during the touch sense phase to output the second control signal to the light emission control line as the light emission control signal, the light emission control signal enabling the OLED to be turned off during the touch sense phase, the display phase comprising a first period of time corresponding to a half period of the first clock signal and a second period of time corresponding to one or more periods of the first clock signal, the method comprising:

maintaining, during the first period of time of the display phase, the first clock signal at the first level, the second clock signal, as an inverted version of the first clock signal, at the second level, and the first control signal at the second level, such that the third transistor is turned on to output the voltage of the first level via the light emission control line;

maintaining, during the second period of time of the display phase, the first control signal at the first level such that the fourth transistor is turned on to output the second control signal via the light emission control line; and maintaining, during the touch sense phase, the first control signal at the first level such that the fourth transistor is turned on to output the second control signal via the light emission control line.

4. A method of driving an active matrix organic light-emitting diode (AMOLED) pixel circuit using a light emission control signal generation circuit, the AMOLED pixel circuit comprising an in-cell touch sensor, an organic light-emitting diode (OLED), a light emission control line and a light emission control transistor, the OLED having a cathode that is connected to a first power source and serves as the in-cell touch sensor, the light emission control transistor having a gate electrode connected to the light emission control line and being configured to control ON/OFF of a current flowing through the OLED, the light emission control signal generation circuit comprising: a first transistor having a gate electrode connected to a first control line, a first electrode for being supplied with a voltage of a first level, and a second electrode connected to a first node, the first control line configured to transfer a first control signal;

a second transistor having a gate electrode for being supplied with a first clock signal, a first electrode for being supplied with a voltage of a second level, and a second electrode connected to the first node; a first capacitor having a terminal connected to the first node and another terminal for being supplied with a second clock signal a third transistor having a gate electrode connected to the first control line, a first electrode for being supplied with the voltage of the first level, and a second electrode connected to a light emission control line; and a fourth transistor having a gate electrode connected to the first node, a first electrode connected to a second control line, and a second electrode connected to the light emission control line, the second control line configured to transfer a second control signal, the second control signal having the second level during a display phase and being a superposition of a touch scan signal and the voltage of the first level during a touch sense phase, the third transistor and the fourth transistor being configured such that only one of the third transistor and the fourth transistor is turned on at any given time under control of the first control signal and a voltage at the first node, the fourth transistor being configured such that it is turned on during the touch sense phase to output the second control signal to the light emission control line as the light emission control signal, the light emission control signal enabling the OLED to be turned off during the touch sense phase, the method comprising:

applying the light emission control signal to the light emission control line to cause the AMOLED pixel circuit to operate to:
turn off the light emission control transistor and perform a data write operation, during the first period of time of the display phase;
turn on the light emission control transistor to perform an OLED light emission operation, during the second period of time of the display phase; and
turn off the light emission control transistor to perform a touch sense operation with the OLED turned off, during the touch sense phase.

5. The method of claim 4, wherein the light emission control transistor is a P-type thin film transistor.

6. The method of claim 4, further comprising performing, by the AMOLED pixel circuit, a reset operation prior to the data write operation during the first period of time of the display phase.

7. The method of claim 4, further comprising synchronously superposing the touch scan signal on signals applied to all other external terminals of the AMOLED pixel circuit at the same time when the light emission control signal is applied to the light emission control line and the touch scan signal is applied to the first power source, during the touch sense phase.

8. The method of claim 4, wherein the display phase and the touch sense phase occur alternatingly to the AMOLED pixel circuit in a time-divisional manner.

* * * * *